(12) United States Patent
Igarashi et al.

(10) Patent No.: US 6,889,428 B2
(45) Date of Patent: May 10, 2005

(54) METHOD OF MANUFACTURING SHEET MATERIAL AND METHOD OF MANUFACTURING CIRCUIT DEVICE USING THE SAME

(75) Inventors: Yusuke Igarashi, Gunma (JP); Noriaki Sakamoto, Gunma (JP); Takeshi Nakamura, Gunma (JP); Yoshiyuki Kobayashi, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/617,339

(22) Filed: Jul. 10, 2003

(65) Prior Publication Data

US 2004/0006869 A1 Jan. 15, 2004

(51) Int. Cl.⁷ .................................................. H05K 3/30
(52) U.S. Cl. .............................. 29/832; 9/825; 9/840; 9/846; 204/920; 427/96; 427/97
(58) Field of Search ........................ 29/825, 832, 840, 29/846; 204/920; 427/96, 97

(56) References Cited

U.S. PATENT DOCUMENTS 6,562,660 B1 * 5/2003 Sakamoto et al. .......... 438/124
2003/0151135 A1 * 8/2003 Sakamoto et al. .......... 257/723

* cited by examiner

Primary Examiner—Carl J. Arbes
(74) Attorney, Agent, or Firm—Fish & Richardson P.C.

(57) ABSTRACT

The invention is to form plated films on a conductive foil a thigh precision, and simplify a procedure of forming the plated film. A resin film composed of a thermosetting resin is formed on the surface of the conductive foil. The resin film of parts which become bonding pads and die pads is eliminated by a laser etching. A clamper presses of the periphery of the block so as to form hermetically sealed spaces on the block. The interior of the clamper is filled with a plating liquid by means of an injection means and an evacuation means, and subsequently, and Ag plated film is formed by an electroplating method.

22 Claims, 14 Drawing Sheets

METHOD OF MANUFACTURING SHEET MATERIAL AND METHOD OF MANUFACTURING CIRCUIT DEVICE USING THE SAME

BACKGROUND OF THE INVENTION

1. Field of the Invention

The present invention pertains to a method of manufacturing a sheet material and a method of manufacturing a circuit device using the same, and, more particularly to a method of manufacturing a sheet material which enables the formation of plated films of uniform thickness over a conductive foil, and a method of manufacturing a circuit device using the same.

2. Description of the Related Art

A lead material coated with a plated film over a surface of a conductive element exhibits excellent conductivity and mechanical strength of the conductive material. The lead material is a high-performance conductor exhibiting corrosion resistance and good solderability of the plating material. Therefore, this material is very often used in electrical or electronic equipment fields, electric cables fields such as various kinds of terminals, connectors, or leads.

When mounting semiconductor elements on the conductive elements and wire-bonding thereto, if hot dipping or electroplating is formed over the surface of the conductive element, the solderability of the conductive element can be improved. Herein, Au or Ag films, etc. are employed as the plated film.

A semiconductor device using an Ag plating to a bonding pad and a die pad will now be described with reference to FIG. 15.

This semiconductor device comprises a lead 3 having an Ag plating 8 at the tip, an island lead 4 having the Ag plating 8 at a portion of an island 2, a semiconductor element 1 mounted on an island 2 via Ag—Si eutectic crystal, metallic wires 5 for electrically connecting an electrode of the semiconductor element 1 and a lead 3, and an insulating resin 6 sealing the entire semiconductor device. By mounting the semiconductor element 1 on the island 2 via the Ag—Si eutectic crystal, heat radiation of the semiconductor element 1 may be improved.

Next, one of the steps of manufacturing the semiconductor device which is forming the Ag plated film will be described.

Referring to FIG. 16A, the island lead 4 having the island 2 and the lead 3 are supplied as one frame as a lead frame 7. The lead frame 7 is formed of a conductive material such as Cu, wherein a plurality of island leads 4 and leads 3 are provided.

Referring to FIG. 16B, one portion of the lead frame 7 is covered with a clamper 9. Herein, one portion of the lead frame 7 is at least a portion becoming the die pad of the island 4 and a portion becoming the bonding pad of the lead 3.

The clamper 9 will now be described. The clamper 9 has a part covering a front side of the lead frame 7 and a part covering a back side (not illustrated). Further, since it has a hollow structure, the interior of the clamper 9 is a hermetically sealed space. Accordingly, if a portion of the lead frame 7 is inserted as mentioned above, only the portion forming the Ag plating 8 is exposed in this space. Herein, hatched parts indicated with numeral 9 in FIG. 16B show parts where the upper and lower clampers are in mesh and represent the area where the hatched parts are exposed.

An Ag plating liquid is injected into this space and the Ag plating can be formed by the electroplating method.

The above describes the Ag plating method, and there are cases when Au plating is used. When Au is used as a plating material, due to cost considerations, a Ni plated film is first formed, and then the Au plated film is formed. Because the Ni plated film acts as a substrate, it is possible to prevent Cu which is the material of the lead frame 7 from dispersing into the Au plated film, and accordingly to prevent the Au plated film bondability from deteriorating.

Another method of forming a plated film will be further described. By using an electrodepositing resist, a plating resist is selectively formed such that surfaces of leads only of portions to be pads are exposed. In this case, the plated film is formed by immersion plating. By this method, the plated films can be formed only at the parts to be the pads, and the plating resists are removed in a post-step.

After the plated film is formed, and performing the steps of die-bonding, wire-bonding and resin sealing, the semiconductor device is completed as shown in FIG. 15.

However, as shown in FIG. 15, in the lead 3 and the island 2, the plated films are also formed on the back surface and the side surface. Since adhesive force between the plated film and the sealing resin is weak, there is a problem that mechanical strength of the semiconductor device goes down.

Further, when the plated film is formed by immersion plating, there is another problem that the plated film remote from an electrode provided on the lead frame is formed to be thicker than the plated film near to the electrode.

For performing the Au plating, the Ni plated film is formed as a groundwork, on which the Au plated film is formed. Accordingly, there is a further problem that the process becomes complicated.

If using the electrodepositing resist to selectively form the plated film, a problem occurs that positioning precision of the plated film is low.

Still further, in case of using a strong alkaline plating liquid, materials of the electrodepositing resist peel. Accordingly, another problem is that the Ag plating using the strong alkaline plating liquid cannot be performed.

SUMMARY OF THE INVENTION

A method of manufacturing a sheet material according to the present invention is provided in view of the above mentioned problems. 1st is a method of manufacturing a sheet material, in which a plated film is formed on a surface of a conductive foil provided with a mask, the surface being exposed at exposed parts of the mask, wherein a clamper covers the conductive foil so as to cover at least the exposed parts of the surface thereof, and a plating liquid is injected into the interior of the clamper for forming the plated film on the surface of the conductive foil exposed at the parts of the mask.

2nd is to solve the problems in that the mask is a resin film made of an insulating resin.

3rd is to solve the problems in that the resin film is a thermosetting resin.

4th is to solve the problems in that the resin film is formed by heating and compressing a prepreg sheet.

5th is to solve the problems in that the resin film is formed by adhering the thermosetting resin via screen printing.

6th is to solve the problems in that the mask is formed of a metal.

7th is to solve the problems in that the exposed parts are parts becoming die pads or bonding pads.

8th is to solve the problems in that the plated film is formed by an electroplating method.

9th is to solve the problems in that principal materials of the plated film are Ag, Pd or Au.

10th is to solve problems in that the conductive foil and the clamper form one hermetically sealed space.

11th is to solve the problems in that the conductive foil is provided with a plurality of blocks which contain a plurality of mounting portions forming circuit devices.

12th is to solve the problems in that the clamper presses simultaneously the plurality of blocks of the conductive foil at outer peripheral parts thereof.

13th is to solve the problems in that the plated films are simultaneously formed by the clamper on the exposed portions of the conductive foil containing a plurality of blocks.

14th is to solve the problems in that the clamper has injection means and evacuation means, and a plating liquid is injected into the interior of the clamper via the injection means, while the plating liquid is evacuated outside of the clamper via the evacuation means.

15th is to solve the problems in that the exposed portion of the mask is formed by selectively laser etching the mask.

16th is to solve problems in that a method of manufacturing a sheet material is a method of manufacturing a sheet material which forms plating films on one continuous conductive foil, wherein one surface of the conductive foil is pressed by the clamper to form spaces on the conductive foil, and a plating liquid is injected inside the space to form the plating films.

17th is to solve the problems in that a method of manufacturing a circuit device, comprises the steps of forming predetermined patterns through half-etching, preparing a conductive foil or a sheet material which is formed with masks in such a manner to expose plate-forming portions composing the patterns, disposing a clamper so that spaces can be formed on the pattern of the conductive foil or the sheet material, injecting a plating liquid into the spaces formed inside the clampers, forming plated films at the plating-forming portions, and fixing semiconductor chips or/and electrical connection means on the plated films.

18th is to the solve the problems in that the clamper is provided with injection means and evacuation means of the plating liquid, and the plating liquid existing in the spaces is fluidized.

19th is to solve the problems in that the mask is a metal or a resin exhibiting corrosion resistance against the plating liquid.

20th is to solve the problems in that a method of manufacturing a circuit device comprises the steps of preparing a conductive foil or a sheet material which is formed with masks in such a manner as to surround electrical contact parts of the semiconductor elements, holding the conductive foil or the sheet material by a clamper so that spaces are formed on the electrical contact parts, and forming the plated films on the electrical contact parts.

21st is to the solve problems in that the conductive foil or sheet material is formed in convex shape by half-etching patterns composing the electrical contact parts.

As mentioned above, by using the clamper to form the plated film, the thickness of the plated film can be made uniform. When forming the plated film, the resin film composed of the insulating resin may be used as mask. Further, the resin film is laser etched so as to form the exposed parts, and by forming the plated the film at the exposed parts, the precision of the position and size of the plated film can be improved.

DESCRIPTION OF THE PREFERRED EMBODIMENTS

A first embodiment describing the structure of the sheet material will now be described.

Figure 1A:
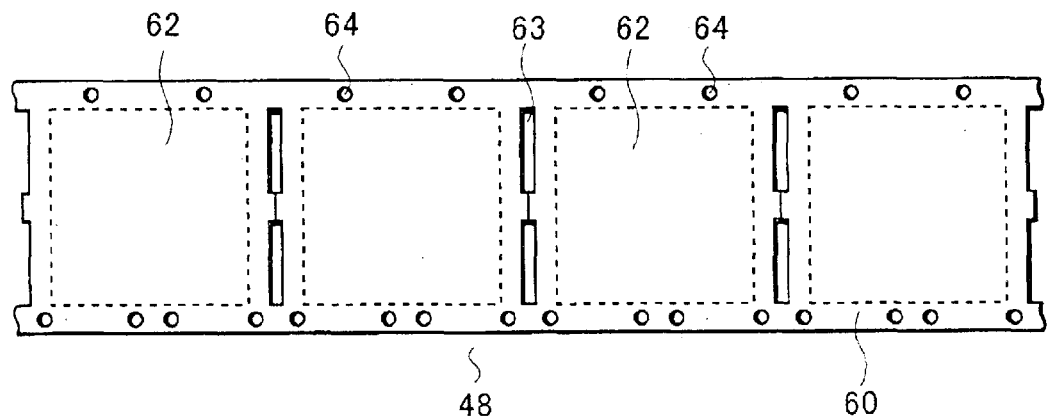
FIGS. 1A, B, C are diagrams illustrating the sheet material according to the invention.
Figure 1B:
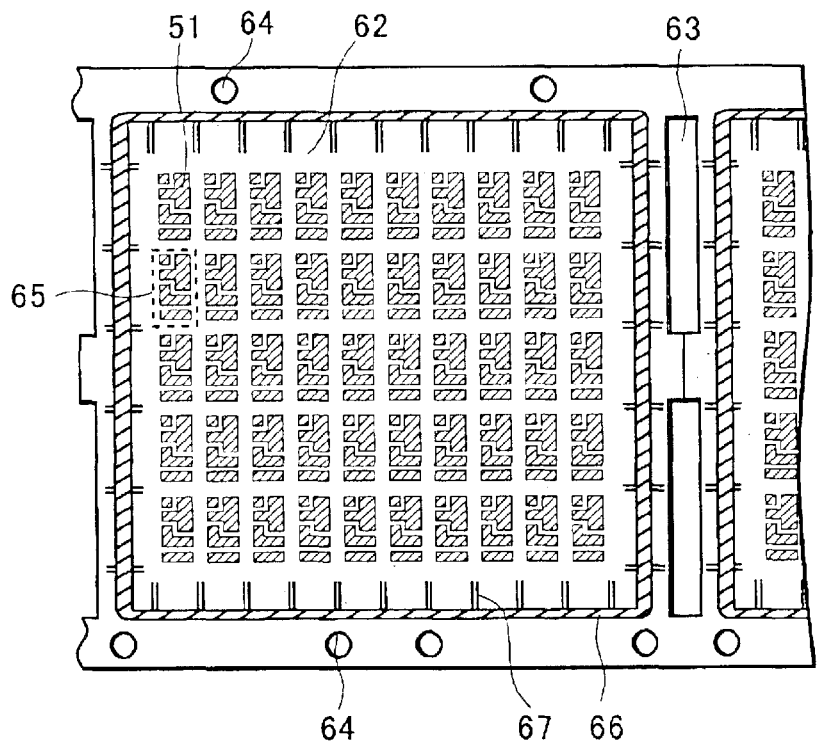
Figure 1C:
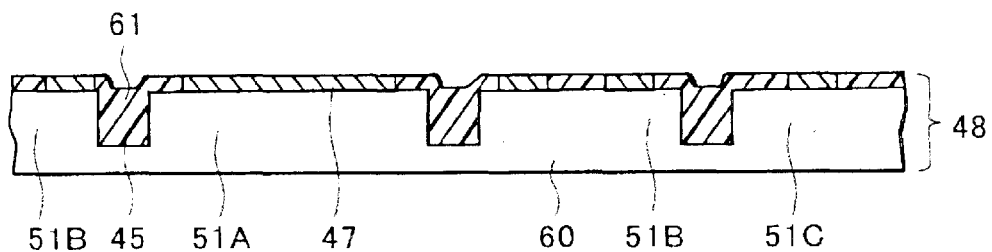

A sheet material 48 according to the invention will be described with reference to FIG. 1. FIG. 1A is a plan view of the sheet material 48, FIG. 1B is an enlarged plan view of one of the plurality of blocks 62 provided with the sheet material 48, and FIG. 1C is a cross sectional view of one of the plurality of mounting portions 65 of the blocks. Herein, the mounting portions 65 are portions which form one circuit device. A sheet material 48 according to the invention has a portion for mainly forming conductive patterns of the circuit device.

As shown in FIG. 1A, the rectangular sheet material 48 is provided with the blocks 62 having a plurality of mounting portions 65, four or five blocks 62 are positioned so as to be separated from one another and are provided with slits 63 therebetween for absorbing stress of the conductive foil 60 caused by heat treatment in a molding process, etc. The conductive foil 60 is provided with index holes 64 at regular intervals in upper and lower peripheries thereof for positioning in the respective steps.

With reference to FIG. 1B, a description about one of the blocks 62 will now be made. The block 62 is provided with a plurality of mounting portions 65 in the interior thereof. Herein, there are 50 mounting portions arranged in a matrix of 5 lines×10 columns, but the number of the mounting portions is arbitrary. In addition, the mounting portions 65 are composed of several conductive patterns 51 partially separated at separating grooves 61.

As shown in FIG. 1C, the sheet material 48 comprises the conductive foil 60, the resin film 45 on the conductive foil 60, and the Ag plated film 47 provided on the conductive foil 60 exposed at the resin film 45. The conductive foil 60 is formed with separating grooves 61, and is electrically divided into individual conductive patterns 51 by removing the conductive foil 60 from the back surface of the block 62 in a step of manufacturing the circuit device.

A characteristic of the sheet material 48 according to the invention is the resin film 45 and the Ag plating 47 provided on the surface of the conductive foil 60.

This characteristic will now be described. The resin film 45 is provided over the entire surface of the conductive foil 60, and exposes the conductive foil 60 of parts formed with the Ag plated film 47. Accordingly, although the resin film 45 is a necessary element for composing the circuit device, it serves as a plating resist in the related art. Moreover, the resin film is removed by laser etching from the part exposing the conductive foil 60. Therefore, the precision in size and positioning of the parts exposing the conductive foil 60 is extremely high. Furthermore, the resin film 45 is formed with the thermosetting resin. Since the thermosetting resin is resistant to strong alkali, the Ag plating can be formed which uses the strong alkaline plating liquid.

In the above description, a resin film 45 composed of the thermosetting resin film 45 is used as the mask forming the Ag plated film 47. Herein, the material of the mask is not only limited to resins, but metals can also be used.

The related art has formed the Au plated film as the groundwork of the Ni plated film, but the sheet material of the invention may adopt the Ag plated film 47. Thereby, the plated film may be enough with one layer.

A second embodiment regarding the structure of the circuit device adopting the sheet material will now be described.

Figure 2A:
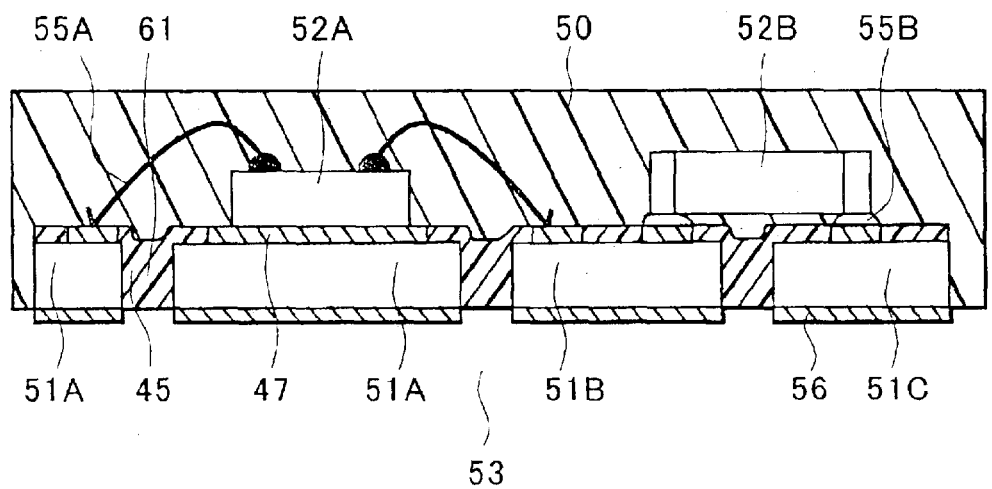
FIG. 2 is a diagram showing a circuit device adopting the sheet material of the invention.
Figure 2B:
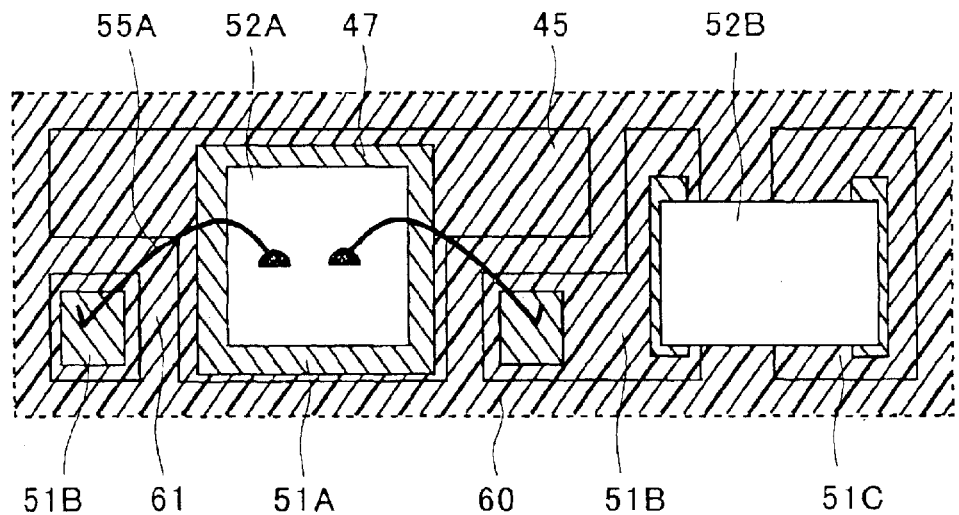

A circuit device 53 of the invention will be described with reference to FIG. 2. FIG. 2A is a cross sectional view of the circuit device 53, and FIG. 2B is a top view thereof.

As shown in FIG. 2A, a circuit device 53 according to the invention comprises the conductive patterns 51, the resin films 45 formed on the conductive patterns 51, the Ag plated film 47 formed over the surface of the conductive patterns 51 exposed from the resin film 45, a semiconductor element 52A and a chip element 52B mounted on the upper part of the Ag plated film 47, metallic wires 55A electrically connecting a bonding electrode of the semiconductor element 52A and the Ag plated film 47 on the upper side of the conductive pattern 51B, and an insulating resin 50 covering the above mentioned elements and supporting the whole area.

The respective elements composing the above mentioned circuit device 53 will now be described.

A the conductive patterns 51, a conductive foil containing Cu as the main material, a conductive foil containing Al as the main material, or a conductive foil containing an alloy such as Fe—Ni can be used. Of course, other conductive materials can be used, preferably etchable conductive materials or laser-evaporable conductive materials. The conductive pattern 51 is maintained as the sheet material halfway through the manufacturing process of the circuit device 53, and by removing the conductive foil from the back surface of the sheet material, it is electrically separated at separating grooves 61, and becomes the conductive patterns 51.

As circuit elements 52, semiconductor bare chips, chip resistors, chip capacitors and others are attached to the conductive patterns 51. Connecting means of the circuit elements 52 include metal connecting board, bump, conductive ball consisting of soldering material, brazing materials such as soldering, conductive paste such as Ag paste, or wire bonding using metallic wires. These connecting means are selected depending on the type of the circuit elements 52 and mounting conditions thereof. Herein, the semiconductor element 52A is fixed face-up, and is electrically connected with the conductive pattern 51B via the metallic wire 55A, and the chip element 52B is fixed to the conductive patterns 51B and 51C by using the soldering material or the Ag paste.

The insulating resin 50 may include the thermosetting resin such as epoxy resin, or a thermoplastic resin such as polyimide resin or polyphenylenesulfide. The insulating resins may include all sorts of resins such resins which harden using a metal mold, or are applied by dipping or coating. In the invention, the insulating resin 50 seals the semiconductor elements, and at the same time supports the entire circuit device.

The Ag plate 47 and the resin film 45 have already been described in the first embodiment which discussed the sheet material, and reference thereof has been omitted herein.

A third embodiment about the method of manufacturing the sheet material and the circuit device will now be described.

Next, a method of manufacturing the sheet material and the circuit device will be described with reference to FIGS. 3 to 14.

Figure 3:
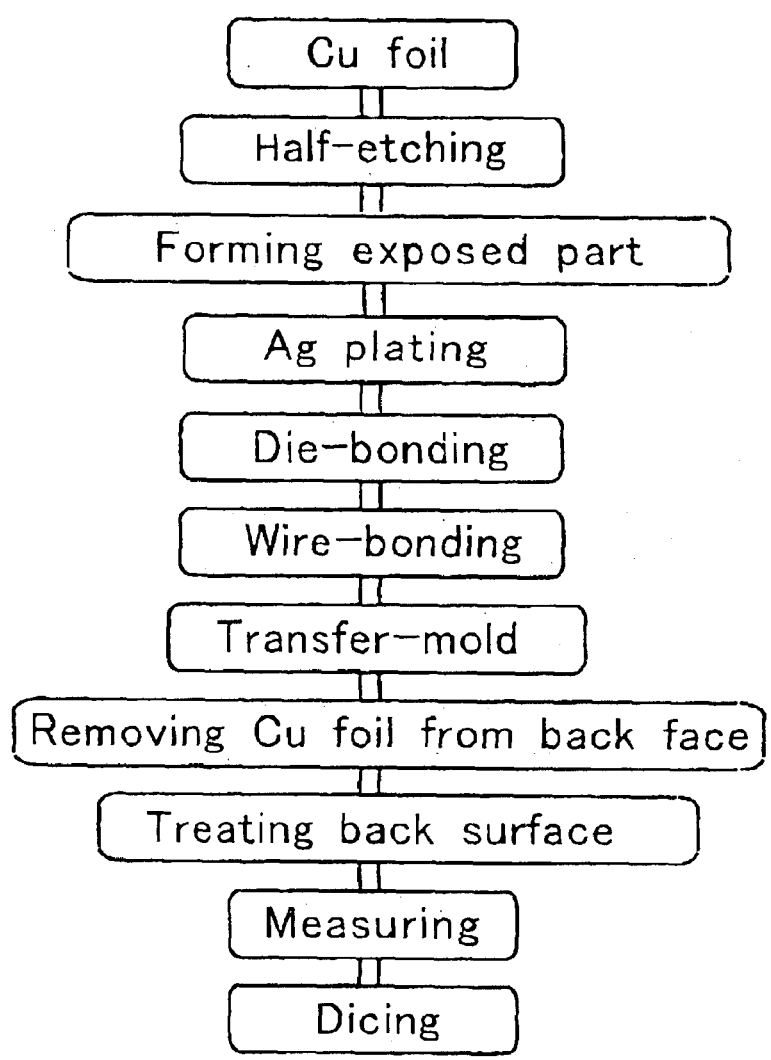
FIG. 3 is a flow chart describing the method of manufacturing the circuit device adopting a sheet material of the invention.

FIG. 3 illustrates a flow chart for manufacturing the circuit device. The conductive patterns are formed through the flow of Cu foil and half-etching. The forming of the sheet material is carried out in the flow of forming the exposed parts and the flow of Ag plating. In the flow of die bond, the semiconductor elements and the chip elements are fixed to the respective mounting portions. In the wire bonding flow, the semiconductor elements and the conductive foil patterns are electrically connected. In the transfer mold flow, common molding is performed with the insulating resin. In the flow of removing Cu foil from the back face, etching is continued on the entire back surface in the sheet material until exposing the insulating resin. A measuring flow determines the quality of the semiconductor elements incorporated in the respective mounting portions, and classifies them according to their properties. A dicing flow separates the insulating resins into the individual circuit devices by dicing.

The respective steps of manufacturing a circuit device of the invention will be described with reference to FIGS. 4 to FIG. 14.

Figure 4A:
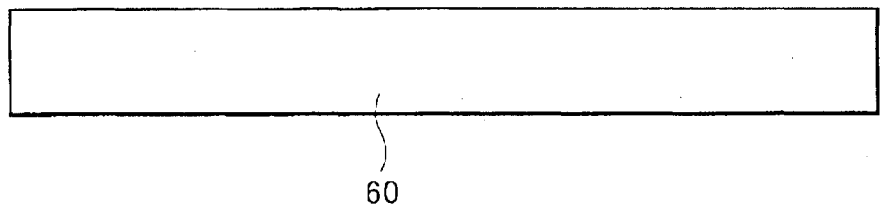
FIG. 4 is a diagram showing the method of manufacturing a circuit device adopting the sheet material of the invention.
Figure 4B:
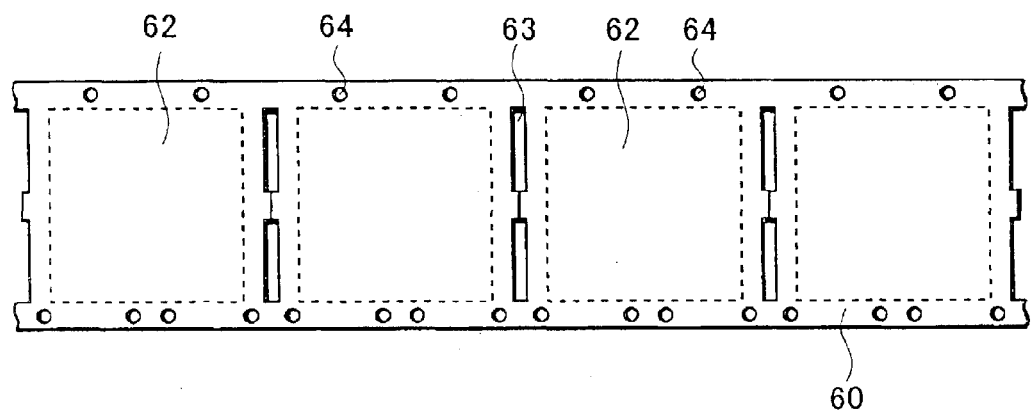
Figure 5:
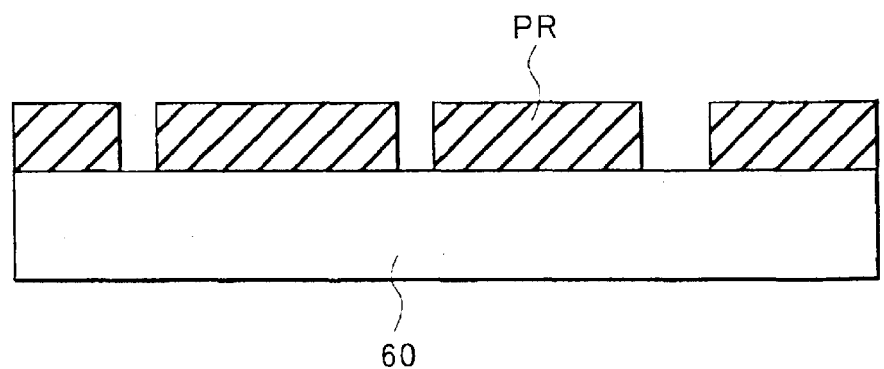
FIG. 5 is a view illustrating the method of manufacturing a circuit device adopting the sheet material of the invention.
Figure 6A:
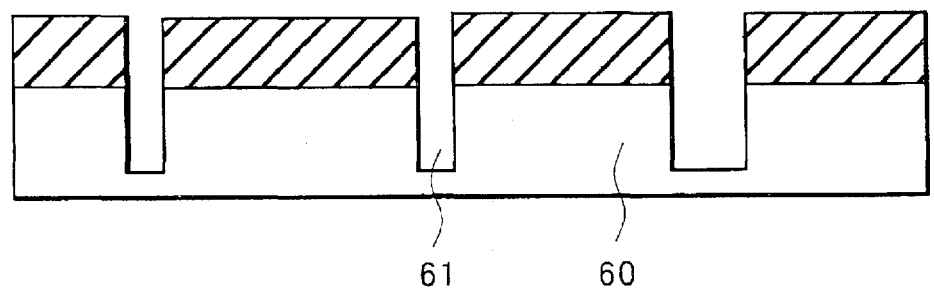
FIG. 6 is a diagram showing the method of manufacturing a circuit device adopting the sheet material of the invention.

A first step of the invention, as shown in FIGS. 4 to FIG. 6, includes preparing the conductive foil 60 and forming the conductive patterns 51 by forming the separating grooves 61 in the conductive foil 60 in an area except for the conductive patterns 51 having a plurality of mounting portions, the separating grooves being shallower than the thickness of the conductive foil 60.

In this step, at first the sheet-like conductive foil 60 as illustrated in FIG. 4A is provided the material of the conductive foil 60 is selected, taking into consideration the adhesive strength, bonding property and plating property of the soldering material, and the material employs the conductive foils of Cu as the main material, Al as the main material, or an alloy such as Fe—Ni.

The thickness of the conductive foil is preferably around 10 μm to 300 μm, considering the subsequent etching. But, as later mentioned, it is sufficient that the thickness may allow to form the separating grooves 61 shallower than the conductive foil 60.

In addition, the sheet-like conductive foil 60 is provided by rolling in a predetermined width, for example, 45 mm or by cutting the conductive foil 60 into rectangular shapes of a predetermined size, and can be fed to later mentioned respective steps.

Concretely, as shown in FIG. 4B, the rectangular conductive foil 60 is provided with the blocks 62 having a plurality of mounting portions, four to five blocks 62 are positioned so as to be separated from one another and are provided with slits 63 therebetween for absorbing stress of the conductive foil 60 caused by heat treatment during molding process. The conductive foil 60 has index holes 64 at regular intervals in upper and lower peripheries thereof for positioning during the respective steps. The rectangular outline and the index holes 64 may be formed at the same time as forming the separating grooves 61.

Next, the conductive foil patterns are formed.

At first, as shown in FIG. 5, photo-resists (anti-etching mask) PR are formed on the Cu foil 60, and are subject to patterning so as to expose the conductive foil 60 at a areas other than the area becoming the conductive patterns 51. Next, the conductive foil 60 is selectively etched through the photo-resist PR. Concretely, the depth of the separating grooves formed by this chemical etching is, for example, 50 μm.

Figure 6B:
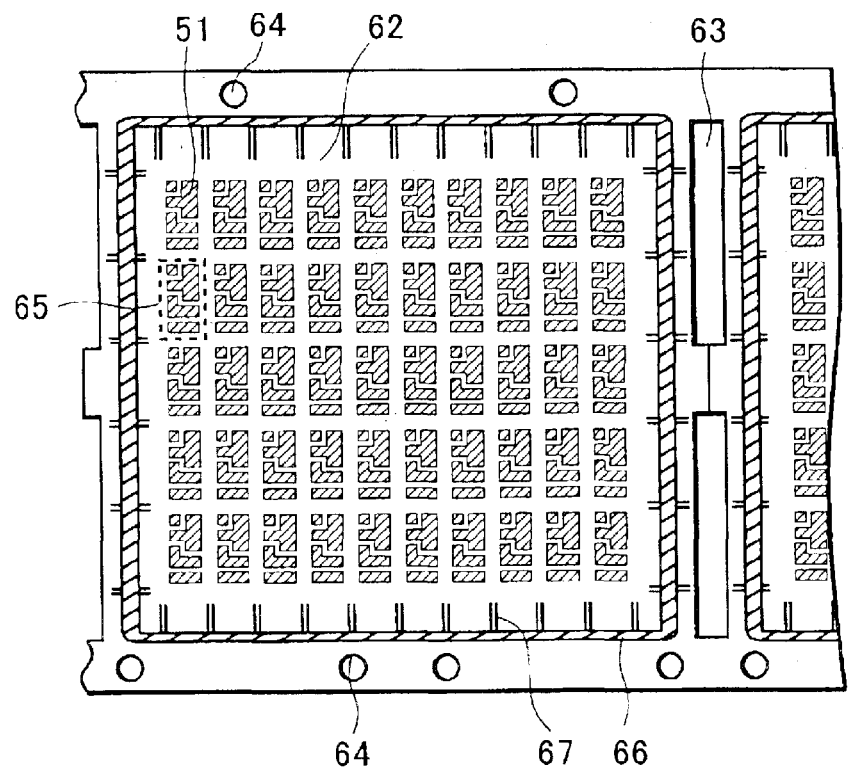

FIG. 6B illustrates the actual conductive pattern which corresponds to an enlarged view of one of the blocks 62 shown in FIG. 4B. Each portion surrounded by dashed line is one mounting portion 65 and composes the conductive pattern 51. One block 62 is provided with a plurality of mounting portions 65 arranged in matrix, and the same conductive patterns 51 is provided per each of the mounting portions 65. At the periphery of each block 62, a frame shaped pattern 66 is provided, and at the inside of and at some distance from the pattern 66, marks 67 are made for positioning when dicing. The frame shaped pattern 66 is used in engaging with a metal mold, and serves to reinforce the insulating resin 50 after etching the back surface of the conductive foil 60.

A second step of the invention, as shown in FIGS. 7 to 8, includes forming the resin film 45 having the exposed portion 46 on the upper surface of the conductive foil 60 and forming the Ag plated film in the exposed portions 46. This step forms the sheet material 48 and characterizes the invention.

Figure 7A:
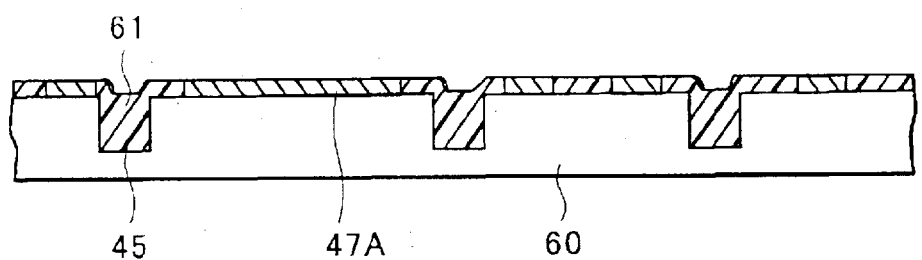
FIG. 7 is a diagram showing the method of manufacturing a circuit device adopting the sheet material of the invention.
Figure 7B:
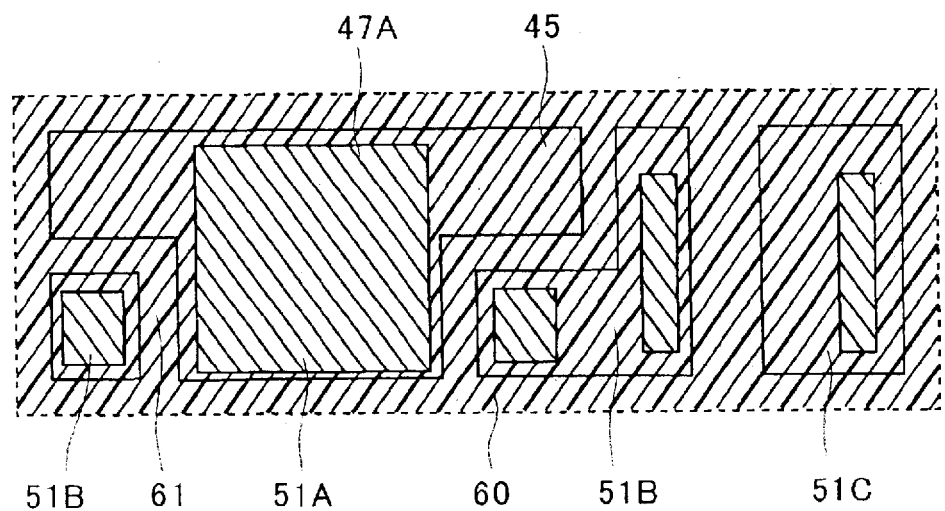
Figure 8A:
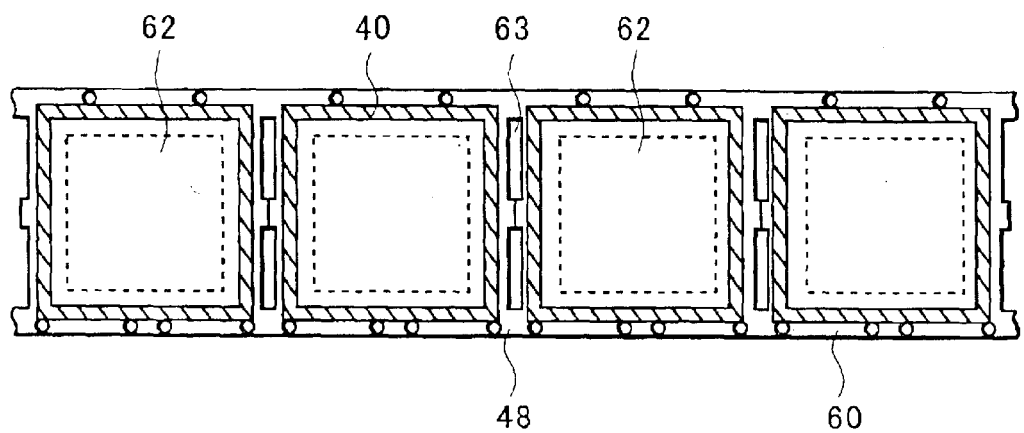
FIG. 8 is a diagram showing the method of manufacturing a circuit device adopting the sheet material of the invention.
Figure 8B:
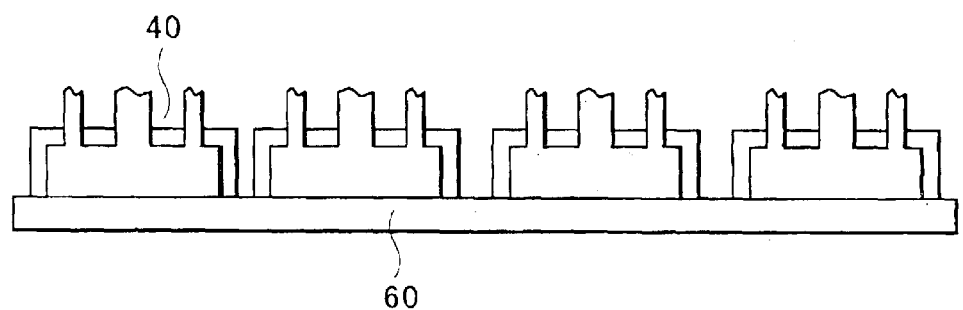
Figure 8C:
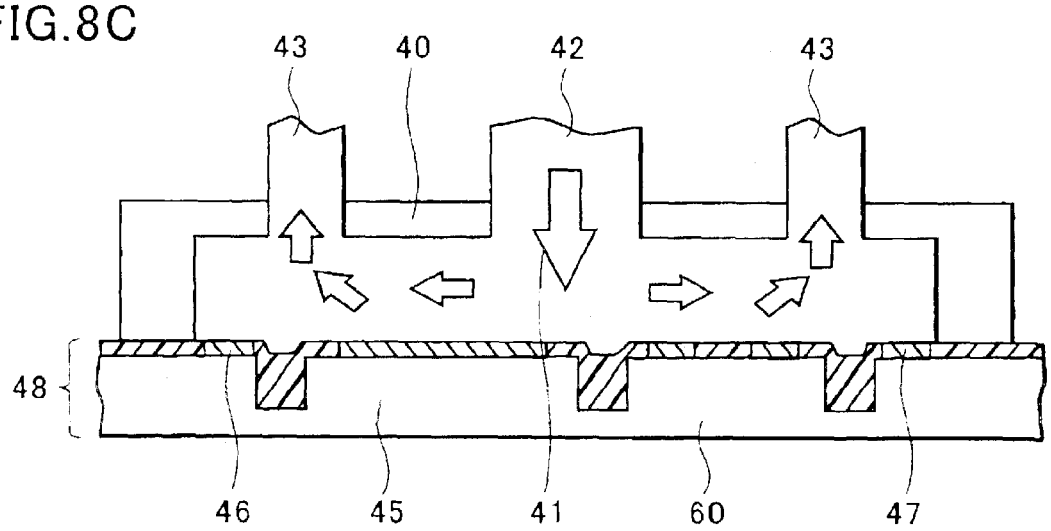

FIG. 7A is a cross sectional view of the conductive foil 60 formed with an exposed portion 47A by partially removing the resin film. FIG. 7B is a plan view of FIG. 7A. FIG. 8A is a plan view showing the clamper 40 pressing the periphery of the respective blocks of the sheet material 48, and FIG. 8B is a cross sectional view thereof. FIG. 8C is an enlarged cross sectional view of one block and the clamper 40 illustrated in FIG. 8B.

At first, a method of forming the resin film 45 on the surface of the conductive foil 60 and forming the exposed portion 47A will be described with reference to FIGS. 7A and 7B.

As illustrated in FIG. 7A, the surface of the conductive foil 60 is covered with the resin film 45. Here, there are two methods of forming the resin film 45. In a first method, the resin film 45 is formed by adhering the thermosetting resin such as an epoxy resin dissolved by a solvent through screen printing, and thermosetting it. In a second method, the resin film 45 is formed by heating and pressing a prepreg sheet in a vacuum press to thereby flatten level differences. The latter method can strengthen the adhesive force between the conductive foil 60 and the resin film 45. Accordingly, this embodiment employs the latter method. The resin film corresponding to parts which become the die pad and bonding pad is removed and functions as the exposed portion 47A.

Here, the resin film 45 is removed by laser etching using a carbon gas laser etc, thereby enabling the improvement of the precision in the positioning as well as the size of an exposed portion 47A. However, the resin film 45 may be removed by etching.

In the invention, the resin film 45 functions as the plating resist used in the related art. The resin film 45 is formed with the thermosetting resin (for example, epoxy resin). Since the thermosetting resin is resistant to the strong alkaline plating liquid, Ag plating can thus be carried out.

In the related art, due to costs consideration, the Au plating is laminated on the Ni plating. However, adopting the Au film, this method raises the cost. Moreover, the procedure of forming plated film becomes complicated, because two plated films of Ni and Au are formed. In addition to that, when forming fine pads, the plated film is formed after the mask is formed on the conductive foil using the resist etc. Further, the conventional resist has a problem regarding corrosion resistance. In other words, the problem is that, owing to the use of the strong alkaline plating liquid when forming the Ag plating, the resist peels.

On the other hand, the invention enables forming the fine die pad and bonding pad by using only the Ag plated film 47. Thus, the plating process may be simplified. A concrete method of forming the plated film will be later described.

Next, as illustrated in FIGS. 8A to 8C, the Ag plated film is formed in the exposed portions 46.

Referring to FIGS. 8A and 8B, the periphery of the respective blocks 62 provided on the conductive foil 60 is simultaneously pressed by using the clampers 40, whereby the Ag plated film can be formed simultaneously on all of the blocks 62 on the conductive foil 60.

Referring to FIG. 8C, a concrete method of forming the Ag plated film 47 will be described. The clamper 40 is cover-shaped having an opening at the lower part thereof, and presses the periphery of the block 62, so that one hermetically sealed space is formed between the clamper 40 and the sheet material 48.

The lead frame as shown in the related art example is different from the sheet material of the invention in that it is provided with spaces. Accordingly, when using the clamper to the conventional lead frame in order to form the plating film, two clampers are used hold the block from upper and lower side. On the contrary, in the invention, one sheet of the lead frame used in the related art is the continuous conductive foil 60. Thus, the conductive foil is pressed by one clamper 40, thereby to form a hermetically sealed space.

The clamper 40 has the injection means 42 and the evacuation means 43. The injection means 42 inject the plating liquid 41 into the clamper 40, while the evacuation means 43 evacuate the plating liquid 41 to the outside of the clamper 40. By using the injection means 42 and the evacuation means 43, the interior of the clamper 40 can be filled with the plating liquid.

The Ag plated film 47 is formed by the electroplating method. Concretely, the conductive foil 60 is provided with an electrode, and DC current is supplied to the plating liquid 41 to form the Ag plated film 47. In this embodiment, the conductive foil 60 is provided with a minus electrode, and the plating liquid is provided with a plus electrode.

The plating liquid 41 flows within the clamper 40 by way of the injection means 42 and the evacuation means 43. Accordingly, an interface between the conductive foil 60 exposed from the exposed portion 46 and the plated film 41 is always contacted with a new plating liquid 41 which has not yet passed through a chemical reaction. Also, when the Ag plated film 47 is formed to some degree on the conductive foil 60, the interface between the Ag plated film 47 and the plating liquid 41 is always contacted with the new plating liquid 41 which has not yet passed through a chemical reaction.

In a flow of rotating the plating liquid for re-use, the plating liquid is continuously supplied into the interior of the clamper from a bath which stores the plating liquid. In short, the plating liquid is dynamic and an excellent plated film can be formed in comparison with a static plating liquid.

Thereby, irrespective of the distance from the electrode, the thickness of the Ag plated film 47 can be made uniform. Moreover, the plated film can be rapidly formed, therefore the plated film forming procedure can be shortened.

In the above description, the plated film was selectively formed on the conductive foil 60 by using the resin film 45 as the mask. However, it is possible, in principle, to form the plated film on the entire surface of the conductive foil 60 without using the resin film 45. Although the plated film is formed by using the insulating resin as the mask in the above description, a metal exhibiting corrosion resistance against the plating liquid can be used as the mask.

Figure 9A:
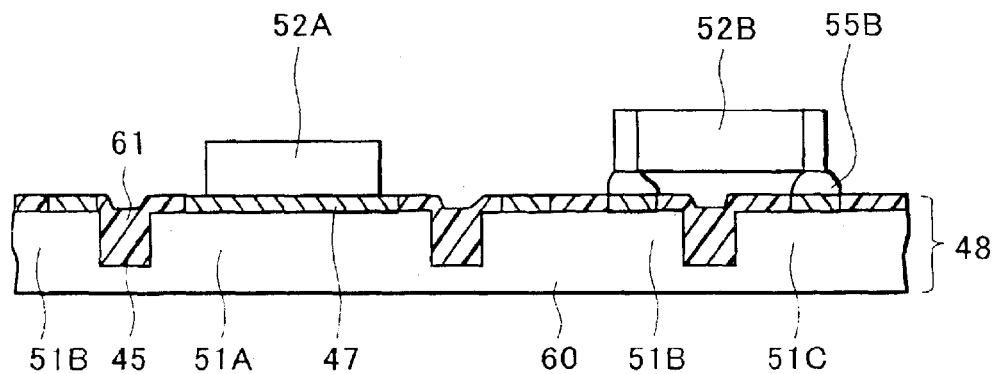
FIG. 9 is a diagram showing the method of manufacturing a circuit device adopting the sheet material of the invention.
Figure 9B:
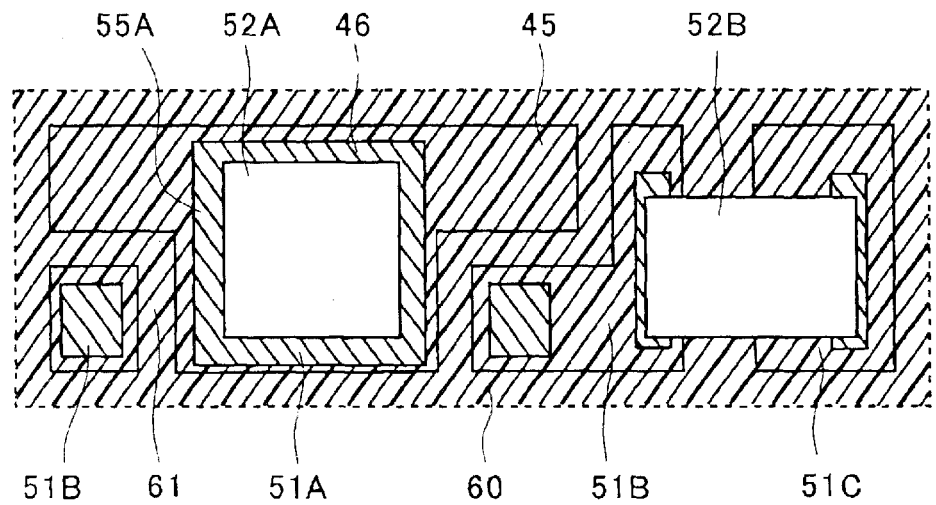

A third step, as seen in FIG. 9, includes fixing the semiconductor elements 52A and the chip elements 36 on the desired patterns 51 of the respective mounting portions. FIG. 9A is a cross sectional view of one mounting portion, and FIG. 9B is a plan view thereof.

The semiconductor element 52A is mounted face-up. As the chip elements 52, a capacitor, a resistor and a diode are mounted. Herein, the semiconductor element 52A is mounted on the Ag plated film 47 of the conductive pattern 51A, and the chip element 52 is fixed by brazing material such as soldering or conductive paste. There may be plurality of semiconductor elements 52A and the chip elements 52B, respectively.

Figure 10A:
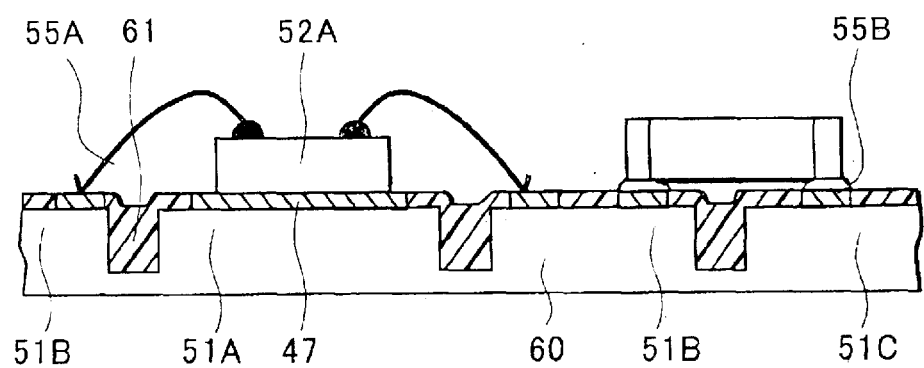
FIG. 10 is a diagram illustrating the method of manufacturing a circuit device adopting the sheet material of the invention.
Figure 10B:
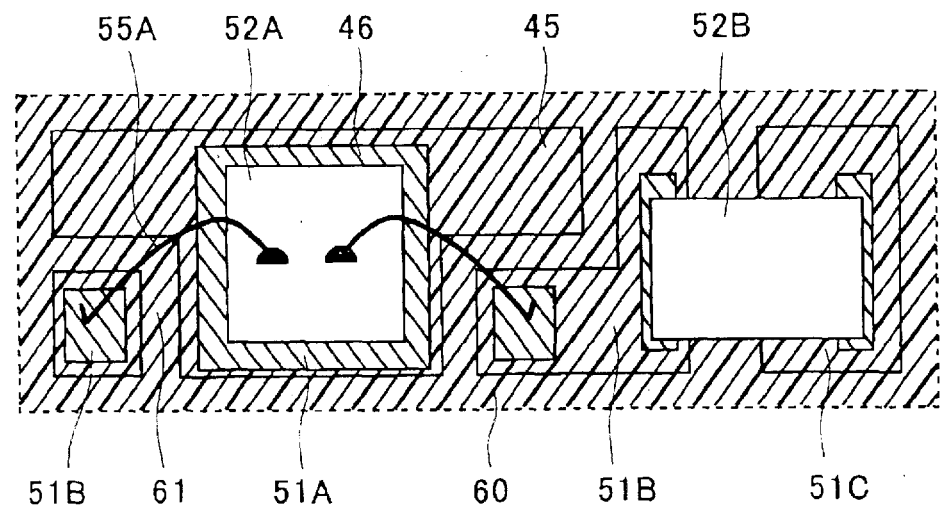

A fourth step, as seen in FIG. 10, includes wire-bonding a bonding electrode 42 of the semiconductor element 40 of the mounting portion 65 and the desired conductive pattern 51. FIG. 10A is a cross sectional view of one mounting portion, and FIG. 10B is a plan view thereof.

With respect to the bonding electrode 42 of the semiconductor element 52A of the mounting portion within the block 62 and the desired conductive pattern 51, in this step, the lump wire-bonding is carried out by ball-bonding via the thermo-compression bonding and by wedge-bonding via supersonic waves.

According to the invention, the wire-bonding can be very efficiently performed in comparison with the conventional method of manufacturing a circuit device which uses the clamper per each of the mounting portions and performs the wire-bonding.

A fifth step of the invention, as shown in FIG. 11, includes lump covering the semiconductor element 52A of each of the mounting portions 65, and carrying out the common mold with the insulating resin 50 to fill the separating grooves 61.

Figure 11A:
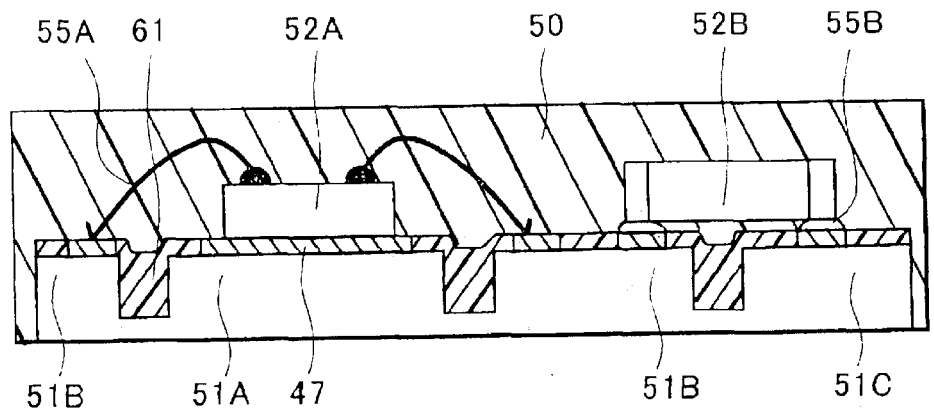
FIG. 11 is a diagram showing the method of manufacturing a circuit device adopting the sheet material of the invention.

In this step, as shown in FIG. 11A, the insulating resin 50 covers the semiconductor element 52A and the chip element 52B. Therefore, the separating grooves 61 between the conductive patterns 51 are filled with the insulating resin 50 to firmly adhere to the resin film 45. This adhesion is made more firm by UV irradiation or plasma irradiation treatment before covering the resin film 45 with the insulating resin 50. The conductive pattern 51 is supported by the insulating resin 50.

In this step, the molding is carried out by transfer mold, injection mold or potting. As the resin materials, the thermosetting resin such as epoxy resin can be used in the transfer mold, and the thermoplastic resin such as polyimide resin or the polyphenylenesulfide can be used in the injection mold.

Figure 11B:
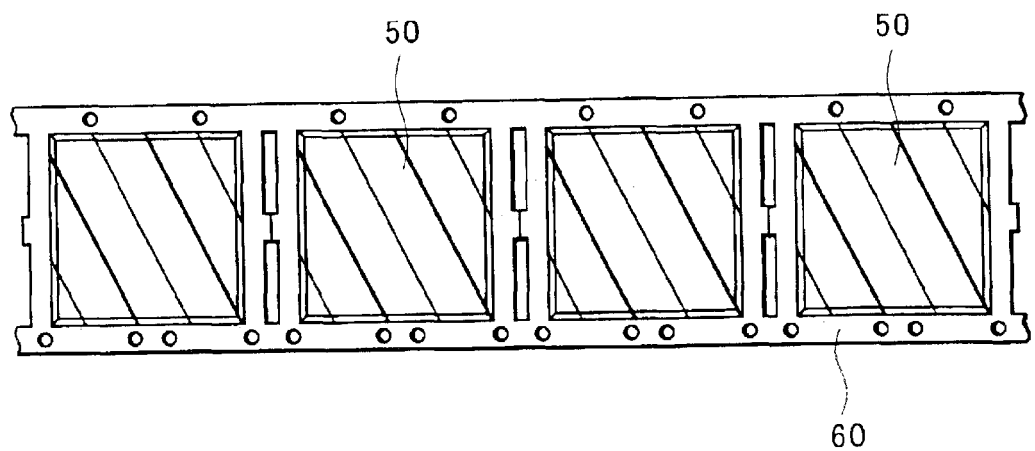

Further, when carrying out the transfer mold or the injection mold, as shown in FIG. 11B, the respective blocks 62 carry the mounting portions 65 in one common metal mold, and common molding is carried out with one insulating resin 50 per each of the blocks, whereby the resin amount is much curtailed in comparison with the method of molding individually each of the mounting portions as with the conventional transferring mold.

The thickness of the insulating resin 50 covering the surface of the conductive foil 60 is so adjusted as to cover around 100 μm from a topmost portion of the metallic wire 34. This thickness can be increased or decreased in view of strength.

This step is characterized in that the conductive foil 60 which becomes the conductive pattern 51 serves as a support substrate until covering the insulating resin 50. In the invention, the conductive foil 60 which becomes the support substrate is a necessary material as an electrode material. Therefore, an advantage is obtained where composing materials and cost are reduced to the most.

Since the separating groove 61 is formed to be shallower than the thickness of conductive foil, the conductive foil 60 is not separated individually as the conductive patterns 51. Accordingly, the sheet-like conductive foil 60 can be dealt as one body, and when molding with the insulating resin 50, it has a merit of facilitating the transfer to mold and the mounting to the metal mold.

Figure 12:
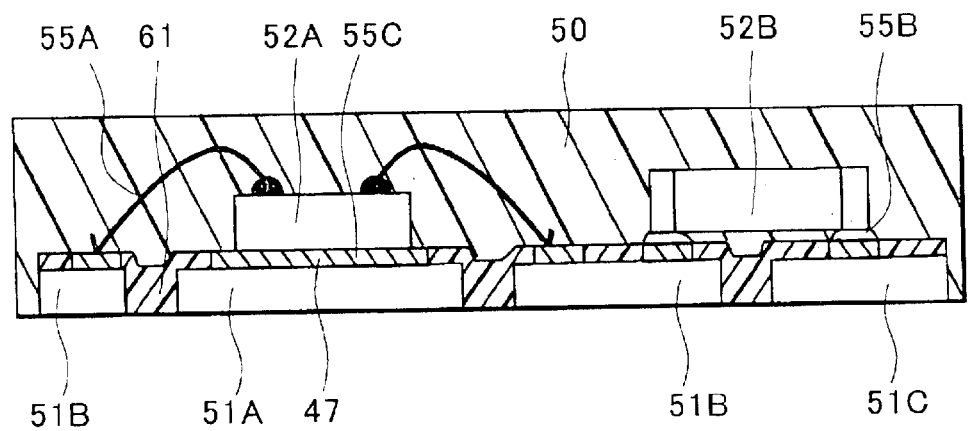
FIG. 12 is a view showing the method of manufacturing a circuit device adopting the sheet material of the invention.

A sixth step of the invention, as shown in FIG. 12, includes etching the entire back surface of the conductive foil 60 until exposing the resin film 45.

This step eliminates the back surface of the conductive foil 60 chemically and/or physically, and separates it as the conductive pattern 51. This procedure is accomplished by polishing, grinding, etching, or laser metal evaporation.

In experiments, the entire surface is cut by around 30 μm using the polishing or grinding apparatus, thereby the resin film 45 is exposed from the separating groove 61. As a result, the conductive foil is separated as the conductive patterns having a thickness of around 40 μm. Also, the entire face of the conductive foil 60 may be subject to wet-etching until almost exposing resin film 45, after which the entire face may be cut by using a polishing or grinding apparatus to expose the resin film 45. Further, the above work may be carried out only by etching, or by cutting halfway through the process and then etch.

As a result, a structure appears where the back surface of the conductive pattern 51 is exposed in the resin film 45. That is, in this the exposed surface of the resin film 45 filled in the separating groove and the exposed surface of the conductive pattern 51 substantially coincide. Accordingly, there is a characteristic that the circuit device can move and self-aligne horizontally due to the surface tension of the solder, etc when mounting is carried out.

Further, the conductive pattern 51 is treated on the back surface, and the circuit device 53 as shown in FIG. 2 is obtained.

Figure 13:
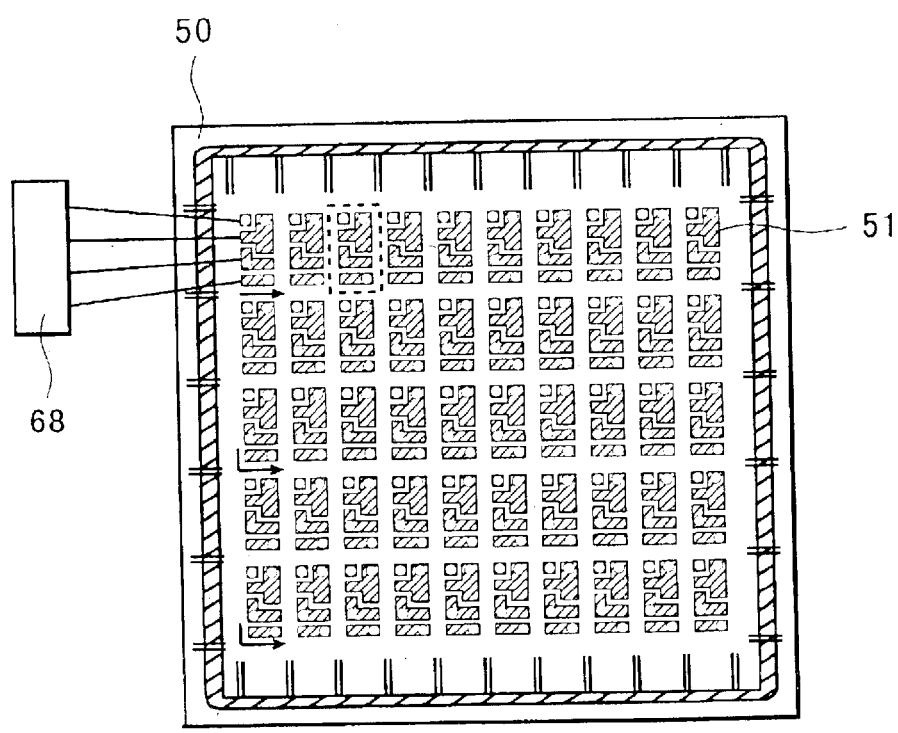
FIG. 13 is a view for explaining the method of manufacturing a circuit device adopting the sheet material of the invention.

A seventh step of the invention, as shown in FIG. 13, includes measuring the characteristics of the semiconductor element of the mounting portion 65 lump molded with the insulating resin 50.

After etching the back surface of the conductive foil 60 in the preceding step, the respective blocks 62 are cut out from the conductive foil 60. Since the block 62 continues with a remaining part of the conductive foil 60 through the insulating resin 50, the block can be mechanically separated from the remaining part of the conductive foil 60 without using any cutting mold.

On the back surface of the block 62, as shown in FIG. 13, back surfaces of the conductive patterns 51 are exposed, and the mounting portions 65 are arranged in matrix exactly in the same way as when forming the conductive patterns 51. A probe 68 is applied to an external connecting electrode 32 exposed from the insulating resin 50 for measuring individual characteristic parameters of the circuit device 53 and determining the quality thereof and apply markings to defective goods with a magnetic ink.

In this step, the circuit devices 53 of the respective mounting portions 65 are supported as one body per each of the blocks 62 with the insulating resin 50, and they are not divided individually. Therefore, the block 62 placed on a mounting bed of a tester is pitch-sent by sizes of the mounting portions 65 in vertical and lateral directions as shown with arrows, so that it is possible to very rapidly measure the circuit devices 53 of the respective mounting portions 65 of the blocks 62. That is, it is no longer necessary to identify the front and back of the circuit device, and recognize the positions of the electrodes as demanded in the related art, so that measuring time can be greatly reduced.

Figure 14:
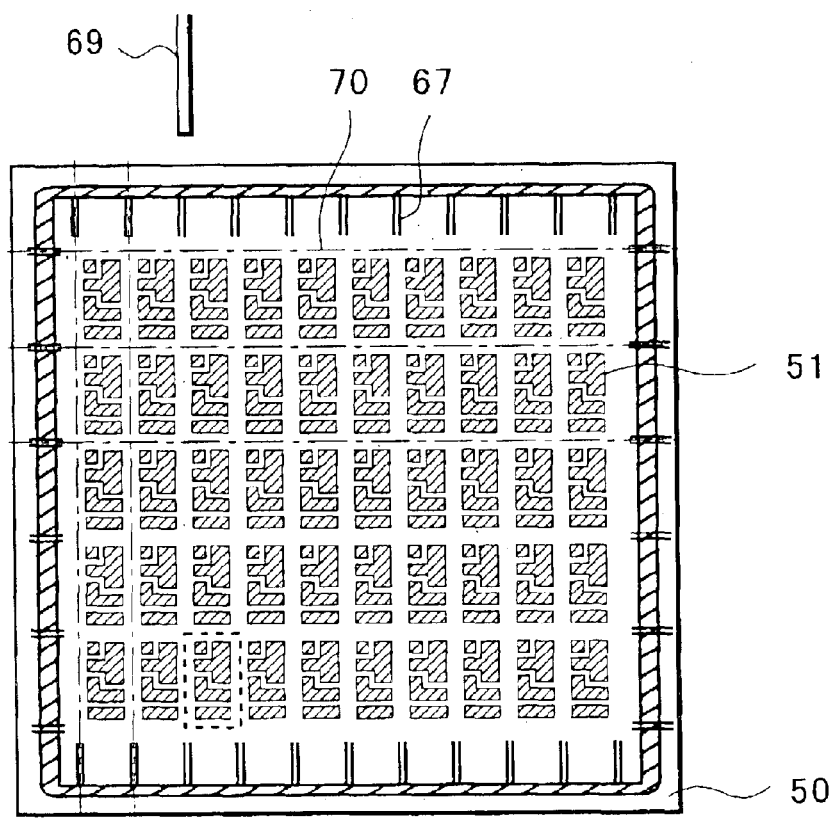
FIG. 14 is a view showing the method of manufacturing a circuit device adopting the sheet material of the invention.
Figure 15:
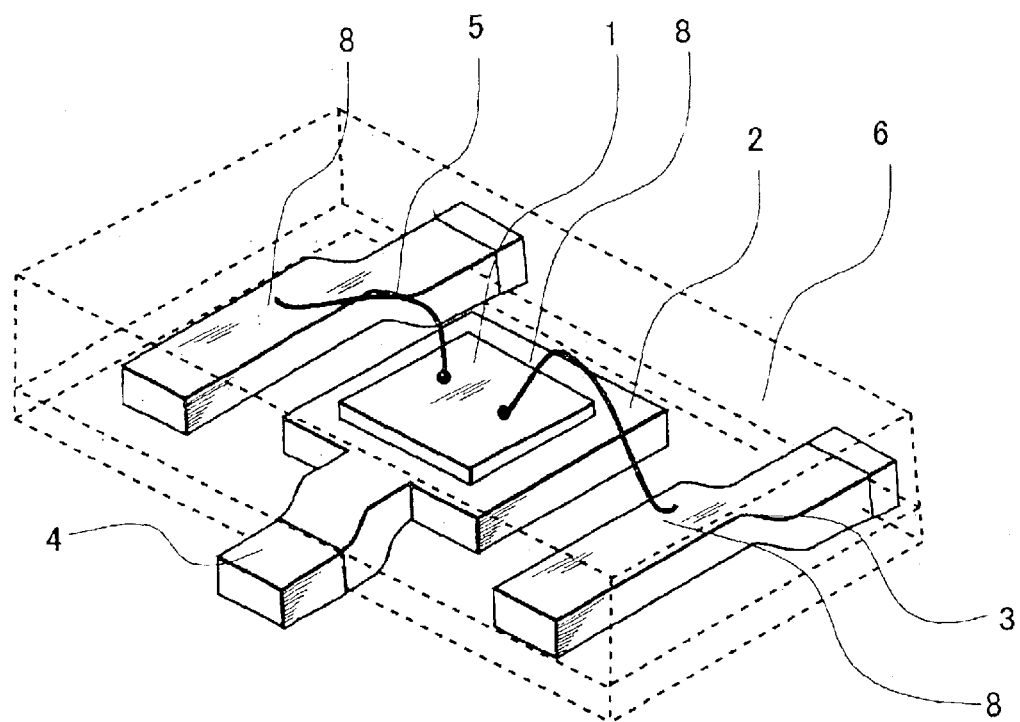
FIG. 15 is a view showing a circuit device adopting the conventional lead frame.
Figure 16A:
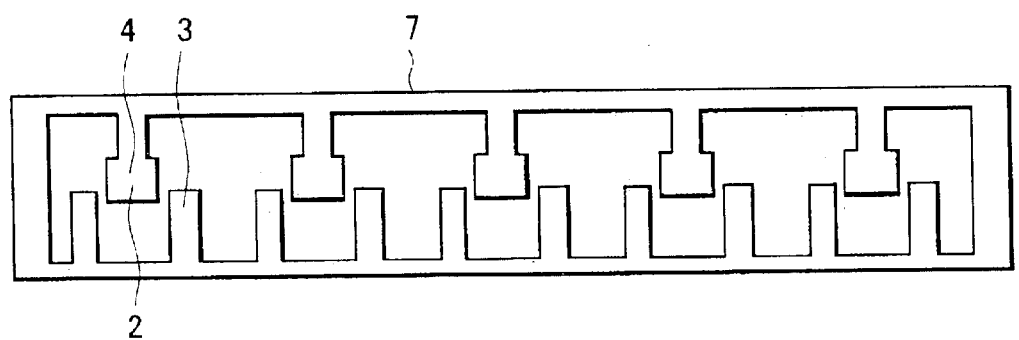
FIG. 16 is views showing the method of manufacturing a circuit device adopting the conventional lead frame.
Figure 16B:
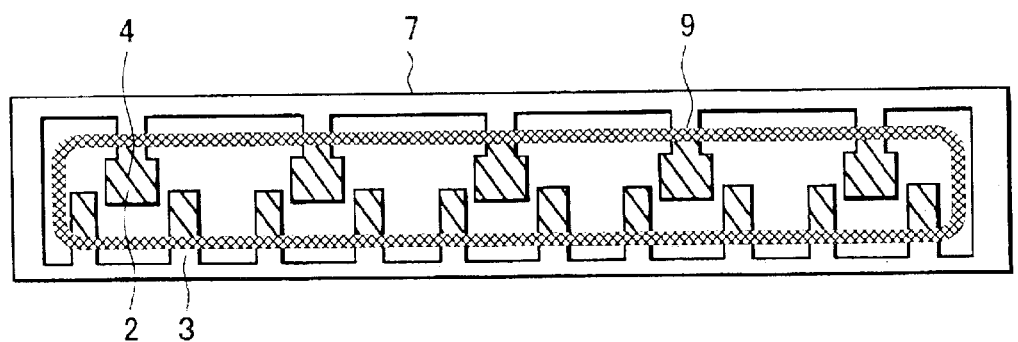

An eighth step of the invention, as shown in FIG. 14, includes separating the insulating resins 50 by dicing each of the mounting portions 65.

In this step, the block 62 is absorbed by vacuum on the mounting bed of the dicing apparatus, and the insulating resin 50 of the separating grooves 61 and the resin film 45 is subject to dicing by a dicing blade 69 along the dicing lines 70 between the respective mounting portions 65, and is divided into the individual circuit devices 53.

In this step, full cut may be performed, but cutting by dicing blade may be carried out at a depth where the insulating resin 50 is almost cut off, and after having removed the blocks from the dicing apparatus, chocolate break may be carried out. When dicing, recognition is made the positioning marks 67 opposing each other inside of the frame-like pattern 66 on the periphery of the respective blocks provided in the above mentioned first step, and dicing is performed on the basis of the recognized marks. As already known, dicing is performed along all the dicing lines 70 in the vertical direction, and thereafter the mounting bed 90 is rotated 90 degree for performing the dicing along the dicing lines 70 in the lateral direction.

In accordance with the method of manufacturing the sheet material, the effects shown below can be obtained.

Firstly, the Ag plated film is formed by pressing one-side of the continuous conductive foil by the clamper.

Secondly, the conductive foil is covered with the resin film composed of the thermosetting resin, the Ag plating can be performed, using the strong alkaline plating liquid. Since the Ag plated film is lower in cost than the conventional Au plated film, the groundwork such as the Ni plating can be made unnecessary. Thus, the procedure of forming the plated film is simplified.

Thirdly, the injection means and the evacuation means cause the plating liquid to always flow in the interior of the clamper. The time for forming the plated film is shortened.

Fourthly, the resin film is formed with the exposed portions by laser etching, and the precision in the positioning and size of the plating to be formed in the exposed portions is heightened. Comparing with the conventional electrodeposition resist, the fine pads can be formed at low cost.

What is claimed is:

1. A method of manufacturing a sheet material, in which a plated film is formed on a surface of a conductive foil provided with a mask, said surface being exposed at exposed parts of the mask, comprising the step of:
   covering the conductive foil with a clamper so as to cover at least the exposed parts of the surface thereof;
   injecting a plating liquid into the interior of the clamper; and
   forming the plated film on the surface of the conductive foil at said parts exposed at the mask.

2. The method of manufacturing the sheet material according to claim 1, wherein the mask is a resin film made of an insulating resin.

3. The method of manufacturing the sheet material according to claim 2, wherein the resin film is a thermosetting resin.

4. The method of manufacturing the sheet material according to claim 3, wherein the resin film is formed by heating and compressing a prepreg sheet.

5. The method of manufacturing the sheet material according to claim 3, wherein the resin film is formed by adhering the thermosetting resin via a screen-printing.

6. The method of manufacturing the sheet material according to claim 1, wherein the mask is formed with a metal.

7. The method of manufacturing the sheet material according to claim 1, wherein the exposed parts are parts becoming die pads or bonding pads.

8. The method of manufacturing the sheet material according to claim 1, wherein the plated film is formed by an electroplating method.

9. The method of manufacturing the sheet material according to claim 1, wherein principal materials of the plated film are Ag, Pd or Au.

10. The method of manufacturing the sheet material according to claim 1, wherein the conductive foil and the clamper form one hermetically sealed space.

11. The method of manufacturing the sheet material according to claim 1, wherein the conductive foil is provided with a plurality of blocks which contain a plurality of mounting portions forming circuit devices.

12. The method of manufacturing the sheet material according to claim 11, wherein the clamper simultaneously presses the plurality of blocks of the conductive foil at peripheral parts thereof.

13. The method of manufacturing the sheet material according to claim 11, wherein the plated films are simultaneously formed by the clamper on the exposed portions of the conductive foil containing a plurality of blocks.

14. The method of manufacturing the sheet material according to claim 1, wherein the clamper has injection means and evacuation means, and a plating liquid is injected into the interior of the clamper by the injection means, while the plating liquid is evacuated outside of the clamper via the discharge means.

15. The method of manufacturing the sheet material according to claim 1, wherein the exposed portion of the mask is formed by selectively carrying out a laser etching on the mask.

16. A method of manufacturing a sheet material, in which plated films are formed on one sheet of a continuous conductive foil, wherein one surface of the conductive foil is pressed by a clamper to form spaces on the conductive foil, and a plating liquid is injected inside the spaces to form the plating films.

17. A method of manufacturing a circuit device, comprising the steps of:

forming predetermined patterns through a half-etching;

disposing a clamper so that spaces can be formed on the pattern of a conductive foil or sheet material;

injecting a plating liquid into the spaces formed inside the clamper;

forming plated films at said plate-forming portions; and fixing semiconductor chips or/and electrical connection means on the plated films.

18. The method of manufacturing the circuit device according to claim 17, wherein the clamper is provided with injection means and evacuation means of the plating liquid, and the plating liquid existing in the spaces is fluidized.

19. The method of manufacturing the circuit device according to claim 17, wherein the mask is a metal or a resin exhibiting corrosion resistance against the plating liquid.

20. A method of manufacturing a circuit device, comprising the steps of:

preparing a conductive foil or a sheet material which is formed with masks in such a manner as to surround electrical contact parts of the semiconductor elements;

holding the conductive foil or the sheet material by a clamper so that spaces are formed on the electrical contact parts; and forming plated films on said electrical contact parts.

21. The method of manufacturing the circuit device according to claim 20, wherein said conductive foil or the sheet material is formed in convex shape by half-etching patterns composing said electrically contacting parts.

22. The method of manufacturing the circuit device according to claim 17, further comprising the step of preparing a conductive foil or a sheet material provided with masks so that plate-forming parts which compose the patterns are exposed.

* * * * *